(12) United States Patent
Lu et al.

(10) Patent No.: US 10,615,494 B2
(45) Date of Patent: Apr. 7, 2020

(54) COUPLING REDUCTION METHOD FOR ANTENNAS IN PACKAGE

(71) Applicant: MediaTek Inc., Hsin-Chu (TW)

(72) Inventors: Yen-Ju Lu, New Taipei (TW);
Yi-Chieh Lin, Kaohsiung (TW);
Wen-Chou Wu, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/685,885

(22) Filed: Aug. 24, 2017

(65) Prior Publication Data

US 2018/0069307 A1 Mar. 8, 2018
US 2018/0248258 A9 Aug. 30, 2018

Related U.S. Application Data

(60) Provisional application No. 62/506,637, filed on May 16, 2017, provisional application No. 62/384,769, filed on Sep. 8, 2016.

(51) Int. Cl.
*H01Q 1/52* (2006.01)
*H01Q 5/378* (2015.01)
(Continued)

(52) U.S. Cl.
CPC .......... *H01Q 1/523* (2013.01); *H01Q 1/2283* (2013.01); *H01Q 1/38* (2013.01); *H01Q 1/525* (2013.01);
(Continued)

(58) Field of Classification Search
CPC .......... H01Q 1/523; H01Q 21/24; H01Q 1/38; H01Q 5/378; H01Q 1/525; H01Q 5/30
(Continued)

(56) References Cited

U.S. PATENT DOCUMENTS 5,870,066 A * 2/1999 Asakura ................. H01Q 1/362
343/702
6,097,339 A 8/2000 Filipovic et al.
(Continued)

FOREIGN PATENT DOCUMENTS

EP 2 416 444 A2 2/2012
EP 2 518 824 A1 10/2012
(Continued)

OTHER PUBLICATIONS

Extended European Search Report for Application No. EP 17190008.7 dated Jan. 3, 2018.
(Continued)

*Primary Examiner* — Brian K Young
(74) *Attorney, Agent, or Firm* — Wolf, Greenfield & Sacks, P.C.

(57) ABSTRACT

A Radio Frequency (RF) device may include a plurality of antennas and one or more conductive traces configured to trap a portion of energy transmitted from at least one of the plurality of antennas. The one or more conductive traces are sized and positioned such that undesired coupling between the plurality of antennas may be suppressed while maintaining performance parameters of at least one of the plurality of antennas. The plurality of antennas and the one or more conductive traces may be formed using a redistribution layer coupled to a chip embedded in a molding layer.

19 Claims, 10 Drawing Sheets

(51) Int. Cl.
| | |
|---|---|
| *H01Q 5/30* | (2015.01) |
| *H01Q 1/22* | (2006.01) |
| *H01Q 1/38* | (2006.01) |
| *H01Q 21/06* | (2006.01) |
| *H01Q 21/08* | (2006.01) |
| *H01Q 21/24* | (2006.01) |

(52) U.S. Cl.
CPC ............ *H01Q 5/30* (2015.01); *H01Q 5/378* (2015.01); *H01Q 21/062* (2013.01); *H01Q 21/08* (2013.01); *H01Q 21/24* (2013.01); *H01L 2223/6677* (2013.01); *H01L 2224/04105* (2013.01); *H01L 2224/12105* (2013.01)

(58) Field of Classification Search
USPC .......................................................... 343/725
See application file for complete search history.

(56) References Cited

U.S. PATENT DOCUMENTS

| | | | | |
|---|---|---|---|---|
| 6,795,026 B2* | 9/2004 | Chiu | ...................... | H01Q 1/243 343/700 MS |
| 7,230,575 B2* | 6/2007 | Jeong | ...................... | H01Q 1/243 343/700 MS |
| 7,564,359 B2* | 7/2009 | Koh | ................... | G06K 19/0723 235/492 |
| 7,973,729 B2* | 7/2011 | Bergman | ................. | H01Q 1/40 343/742 |
| 8,460,967 B2 | 6/2013 | Lachner et al. | | |
| 8,866,292 B2 | 10/2014 | Beer et al. | | |
| 10,312,203 B2* | 6/2019 | Chiang | ............... | H01L 21/6835 |
| 10,374,313 B2* | 8/2019 | Kwon | ..................... | H01F 17/00 |
| 10,389,008 B2* | 8/2019 | Socher | ................. | H01Q 1/2283 |
| 2012/0274532 A1 | 11/2012 | Kurashima et al. | | |
| 2013/0017653 A1 | 1/2013 | Lachner et al. | | |
| 2015/0288061 A1 | 10/2015 | Liu | | |
| 2015/0295311 A1 | 10/2015 | Bringuier et al. | | |

FOREIGN PATENT DOCUMENTS

| | | |
|---|---|---|
| EP | 2 416 444 A3 | 1/2013 |
| WO | WO 2015/094835 A1 | 6/2015 |
| WO | WO 2015/125028 A2 | 8/2015 |

OTHER PUBLICATIONS

Fischer et al., 77-GHz Multi-Channel Radar Transceiver With Antenna in Package, IEEE Transactions on Antennas and Propagation, vol. 62, No. 3, Mar. 2014, 1386-1394.

Zhang et al., A planar 60 GHz antenna for MIMO/diversity applications, Research Institute of Electronic Science and Technology, Univ. of Electronic Science and Technology of China, 15th International Conference on Electronic Packaging Technology, IEEE, 2014, pp. 1350-1352.

* cited by examiner

COUPLING REDUCTION METHOD FOR ANTENNAS IN PACKAGE

CROSS REFERENCE TO RELATED APPLICATIONS

This application claims priority to and the benefit of U.S. Provisional Patent Application Ser. No. 62/506,637, filed on May 16, 2017 and entitled "Coupling Reduction Method For Antennas In Package," which is hereby incorporated herein by reference in its entirety. This application also claims priority to and the benefit of U.S. Provisional Patent Application Ser. No. 62/384,769, filed on Sep. 8, 2016, titled "Coupling Reduction Method For Antennas In Package," which is hereby incorporated herein by reference in its entirety.

TECHNICAL FIELD

Aspects of the present disclosure relates to radio frequency (RF) devices, such as RF communication devices and/or RF detection devices, and in particular to novel RF devices with reduced coupling between antennas in package.

BACKGROUND

Electromagnetic wave frequencies that range from 3 kHz to 300 GHz are sometimes referred to as radio frequencies. RF signals have been used for many applications such as communications and radar. Some RF devices employ antennas.

SUMMARY

Radio frequency (RF) devices are provided.

Some embodiments relate to a radio frequency (RF) device comprising first and second antennas formed in a redistribution layer of a package and at least one conductive trace formed in the redistribution layer of the package. The at least one conductive trace may separate from the first and second antennas, wherein the first antenna may be a transmitter antenna, the second antenna may be a receiver antenna, and the at least one conductive trace may be sized and positioned to couple energy from the first antenna.

In some embodiments, both the first and second antennas may be positioned on a same side of each of the at least one conductive trace.

In some embodiments, the RF device may comprise first and second ground terminals.

In some embodiments, the at least one conductive trace may comprise first and second conductive traces, wherein the first conductive trace may be connected to the first ground terminal and the second conductive trace may be connected to the second ground terminal.

In some embodiments, the RF device may be tuned for a wavelength $\lambda$. The at least one conductive trace may have an open end and an end connected to a ground terminal, and a length between the open end and the end connected to the ground terminal substantially equal to an odd multiple of a quarter of the wavelength $\lambda$.

In some embodiments, each of the first and second antennas may comprise an antenna element and a feeder. A distance between the antenna elements of the first and second antennas may be greater than a distance between the feeders of the first and second antennas.

In some embodiments, an isolation between the first and second antennas may have a notch at a frequency corresponding to the wavelength $\lambda$.

In some embodiments, a lowest point of the notch may be less than −35 dB.

Some embodiments relate to a radio frequency (RF) device comprising a molding layer, a chip embedded within the molding layer, a redistribution layer coupled to the chip, an antenna formed in the redistribution layer, and a conductive trace formed in the redistribution layer. The conductive trace may be sized and positioned for trapping a portion of energy transmitted from the antenna.

In some embodiments, the chip may comprise a transmitter and/or a receiver.

In some embodiments, the antenna may comprise an antenna element and a feeder. The feeder may have a first end connected to one of a group of terminals consisting of a ground terminal and a first output of the chip, a second end connected to a second output of the chip, and a third end connected to the antenna element. The conductive trace may comprise an open end and an end connected to the ground terminal.

In some embodiments, the conductive trace may be substantially parallel to the feeder.

In some embodiments, the conductive trace may be substantially perpendicular to the feeder.

In some embodiments, the conductive trace may comprise an open end and an end connected to a ground. The antenna may be tuned for a wavelength $\lambda$. A length between the open end of the conductive trace and the end connected to the ground substantially may equal to an odd multiple of a quarter of the wavelength.

In some embodiments, the conductive trace may be a first conductive trace. The device may comprise a plurality of conductive traces formed in the redistribution layer, each of the plurality of conductive traces comprising an open end and an end connected to a ground terminal, wherein the plurality of conductive traces include the first conductive trace.

In some embodiments, the first conductive trace may have a first length selected to improve isolation performance in a first frequency range, and a second conductive trace of the plurality of conductive traces may have a second length different from the first length, the second length being selected to improve isolation performance in a second frequency range different from the first frequency range.

In some embodiments, the antenna may be a first antenna, the antenna element may be a first antenna element, the feeder may be a first feeder, the chip may be a transmitting chip, and the ground terminal may be a first ground terminal. The RF device may further comprise a second antenna formed in the redistribution layer. The second antenna may comprise a second antenna element and a second feeder, the feeder having a first end connected to one of a group of terminals consisting of a second ground terminal and a first output of a receiving chip, a second end connected to a second output of the receiving chip, and a third end connect to the second antenna element.

In some embodiments, the device may comprise a second conductive trace formed in the redistribution layer, the second conductive trace comprising an open end and an end connected to the second ground terminal.

In some embodiments, a distance between the first and second conductive traces may be greater than a distance between the first and second antenna elements.

In some embodiments, the redistribution layer may be metallic.

The foregoing summary is provided by way of illustration and is not intended to be limiting.

BRIEF DESCRIPTION OF DRAWINGS

In the drawings, each identical or nearly identical component that is illustrated in various figures is represented by a like numeral. For purposes of clarity, not every component may be labeled in every drawing. The accompanying drawings are not necessarily drawn to scale, with emphasis instead being placed on illustrating various aspects of the techniques and devices described herein.

DETAILED DESCRIPTION

The inventors have recognized and appreciated that a Radio Frequency (RF) device may include a plurality of antennas closely arranged. For example, a distance between adjacent antennas may be 0.5 mm to 8 mm. In another example, a distance between adjacent antennas may be within $0.05\lambda$ to $10\lambda$, where $\lambda$ is a wavelength corresponding to an operation frequency of the antennas. As a result, there may be electromagnetic coupling between the plurality of antennas, which may degrade the RF device's performance. For example, a first antenna in an RF device may be used for transmitting signals, and a second antenna in the same RF device may be used for receiving signals. When the transmitter antenna turns on, the transmitter antenna may induce an electromagnetic field. Because the receiver antenna is located near the transmitter antenna, the receiver antenna may capture some power transmitted by the transmitter antenna, which may degrade the receiver antenna's performance. For example, the receiver antenna may be saturated and desensed, which would result in a deteriorated signal to noise ratio. The inventors have also recognized and appreciated that reducing the electromagnetic coupling between antennas by keeping the antennas far apart may prevent miniaturization of RF devices.

Accordingly, in some embodiments, techniques are provided that may increase RF device performance without increasing package size. As a result, an RF device may have high isolation (e.g., less than −30 dB of power transfer) between the antennas when operating at high frequencies (e.g., in the 78 GHz band). In some embodiments, isolation may be measured as S21, namely, power transferred to the receiver antenna from the transmitter antenna. In some embodiments, S21 may be measured by a vector network analyzer. In some embodiments, S21 may be measured using a known transmitter antenna and a known receiver antenna. One or more of these techniques may be used in a wide range of applications including, for example, communication and sensing devices for automobiles, mobile devices (e.g., smartphones and tablets), radars, and Internet of Things (IoT).

The inventors have recognized and appreciated that one or more conductive traces may be included in an RF device and may be sized and positioned to function as an energy trap such that a portion of energy transmitted from a first antenna may be trapped thereby reducing undesired coupling between a second antenna and the first antenna. The inventors have further recognized and appreciated that the one or more conductive traces may be sized and positioned such that the undesired coupling between the second antenna and the first antenna is suppressed while maintaining performance parameters of the first and second antenna (e.g., antenna gain, reflection coefficient, radiation pattern, and efficiency).

In some embodiments, an RF device may include a plurality of conductive traces formed within a redistribution layer. One or more of the conductive traces may be configured as one or more antennas. One or more other conductive traces may be configured to trap energy from an antenna. A conductive trace configured to trap energy from an antenna may be referred to herein as a stub.

In some embodiments, a stub may have an open end and another end connected to a reference potential, which may be an earth ground, a DC voltage, or another suitable reference potential. In some embodiments, each antenna may have an associated ground ring and there may be at least one stub sharing the associated ground ring with the antenna. In some embodiments, multiple stubs may share a same ground ring with the antenna.

In some embodiments, one or more stubs may be placed on an outside of a pair of transmitter and receiver antennas in an RF device (as opposed to between the transmitter and receiver antennas). Alternatively, or additionally, one or more stubs may be placed between the transmitter and receiver antennas.

In some embodiments, one or more stubs may be placed parallel to a feeder of a transmitter or receiver antenna in an RF device. Alternatively, or additionally, one or more stubs may be placed perpendicular to a feeder of a transmitter or receiver antenna in an RF device. Alternatively, or additionally, one or more stubs may be placed at an angle with respect to a feeder of a transmitter or receiver antenna in an RF device.

In some embodiments, one of transmitter and receiver antennas in an RF device may have at least one associated stub, while the other one of the transmitter and receiver antennas in the RF device may not have any associated stub.

Figure 1:
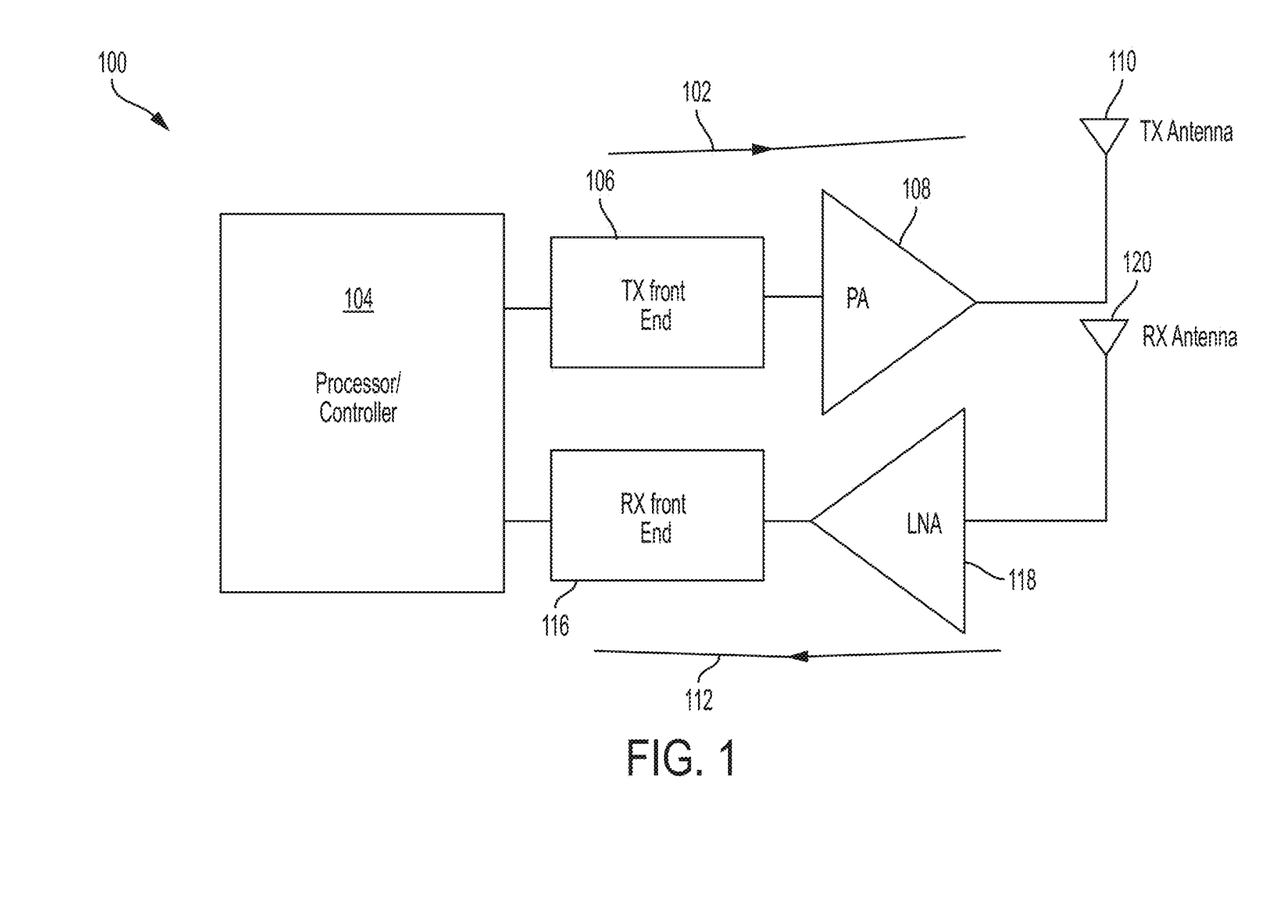
FIG. 1 is a block diagram of an illustrative Radio Frequency (RF) system, according to some embodiments.

FIG. 1 shows a block diagram of an illustrative Radio Frequency (RF) system 100, according to some embodiments. The RF system 100 may include a transmitter path 102 and a receiver path 112. In the transmitter path, a processor/controller 104 may generate a carrier signal, which may be delivered to a power amplifier (PA) 108 through a transmitter front end 106. The carrier signal may be amplified by the PA and coupled to a transmitter antenna 110. The transmitter front end may include circuitry such as one or more filters and/or mixers. In the receiver path, a receiver antenna 120 may capture a signal, which may be amplified by a low noise amplifier (LNA) 118. The amplified signal may be sent to the processor/controller 104 through a receiver front end 116. The receiver front end may include circuitry such as one or more filters and/or mixers (e.g., down-conversion mixers).

Figure 2A:
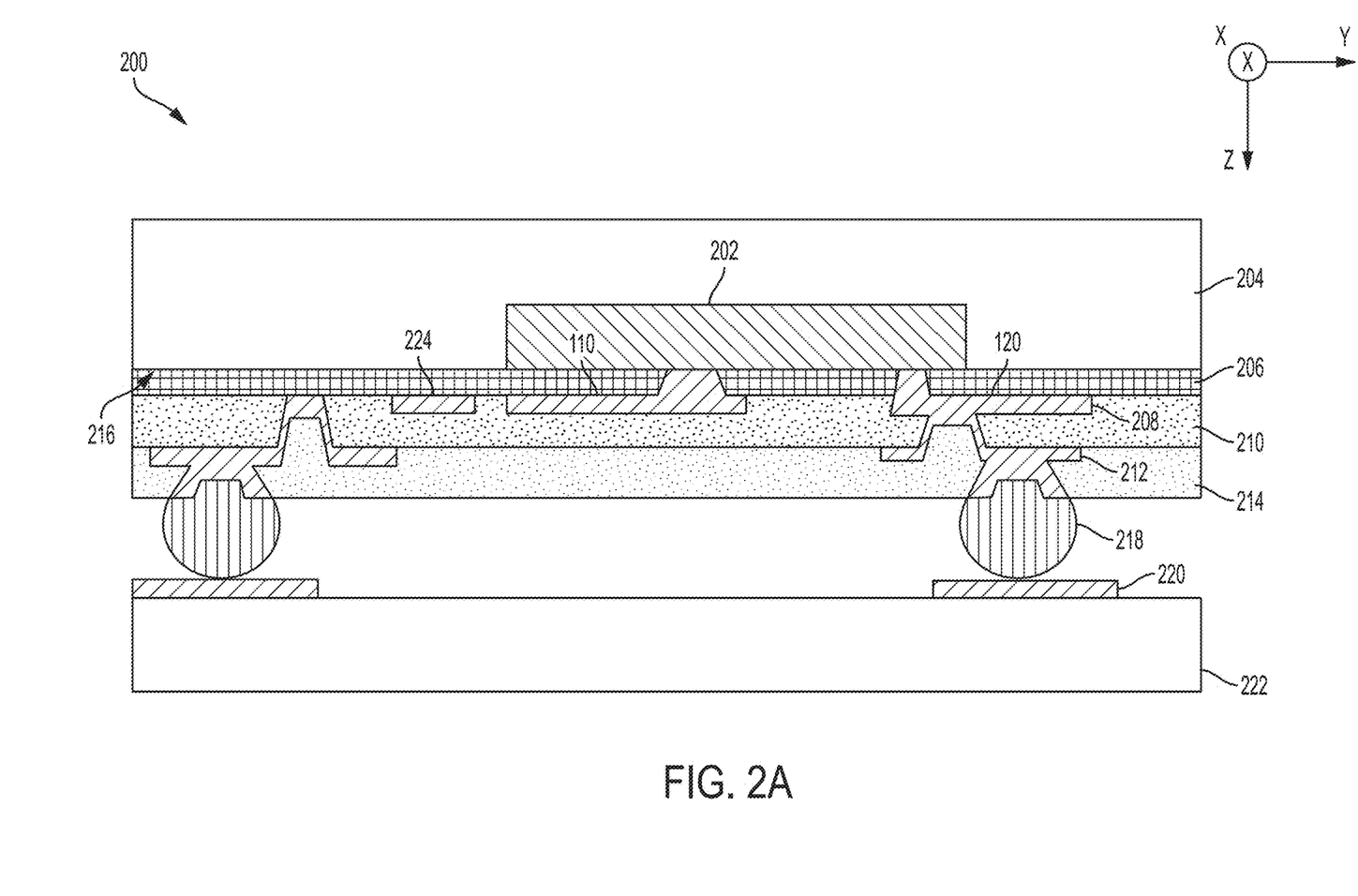
FIG. 2A is a cross-sectional view of an illustrative RF device having a stub sized and positioned to trap energy irradiated from an antenna, according to some embodiments.

In some embodiments, the RF system 100 may include an illustrative RF device 200. FIG. 2A illustrates a cross-sectional view of the RF device 200, according to some embodiments. The RF device 200 may include a chip 202 encapsulated by a molding layer 204, first and second redistribution layers (RDL) 208 and 212, and first, second, and third dielectric layers 206, 210, and 214 to provide isolation between the chip 202 and the first and second RDLs 208 and 212. The first and second RDLs 208 and 212 may be substantially aligned along a z direction. A surface of the chip 202 and a surface of the molding layer 204 may lie on a same plane 216. The plane 216 may be parallel to an x-y plane that is perpendicular to the z direction. The first and second RDLs 208 and 212 may be formed of aluminum, copper, tungsten, gold, or any other suitable conductive material, or any number of conductive materials in any suitable combination. The first and second RDLs 208 and 212 may be formed of the same conductive material in some embodiments, or different conductive materials. The first RDL 208 may be formed to provide electrical accesses to the chip 202. The second RDL 212 may be formed to define landing pads for solder balls 218. The chip 202 may be interconnect to a metal layer 220 on a PCB 222 through the solder balls. Although two RDLs are illustrated in the example, it should be appreciated that aspects of the present disclosure is not limited in this regard. The RF device 200 may include one, three, or any suitable number of RDLs.

In some embodiments, the chip 202 may be an integrated circuit chip. For example, in some embodiments, the chip 202 may be a monolithic microwave integrated circuit (MMIC) chip for microwave engineering processes. In some embodiments, the chip 202 may include any number and combination of circuits including, for example, the illustrative transmitter front end (TX front fend) 106, the illustrative power amplifier (PA) 108, the illustrative receiver front end (RX front end) 116, the illustrative LNA 118, and/or the illustrative processor/controller 104 shown in FIG. 1.

Figure 2B:
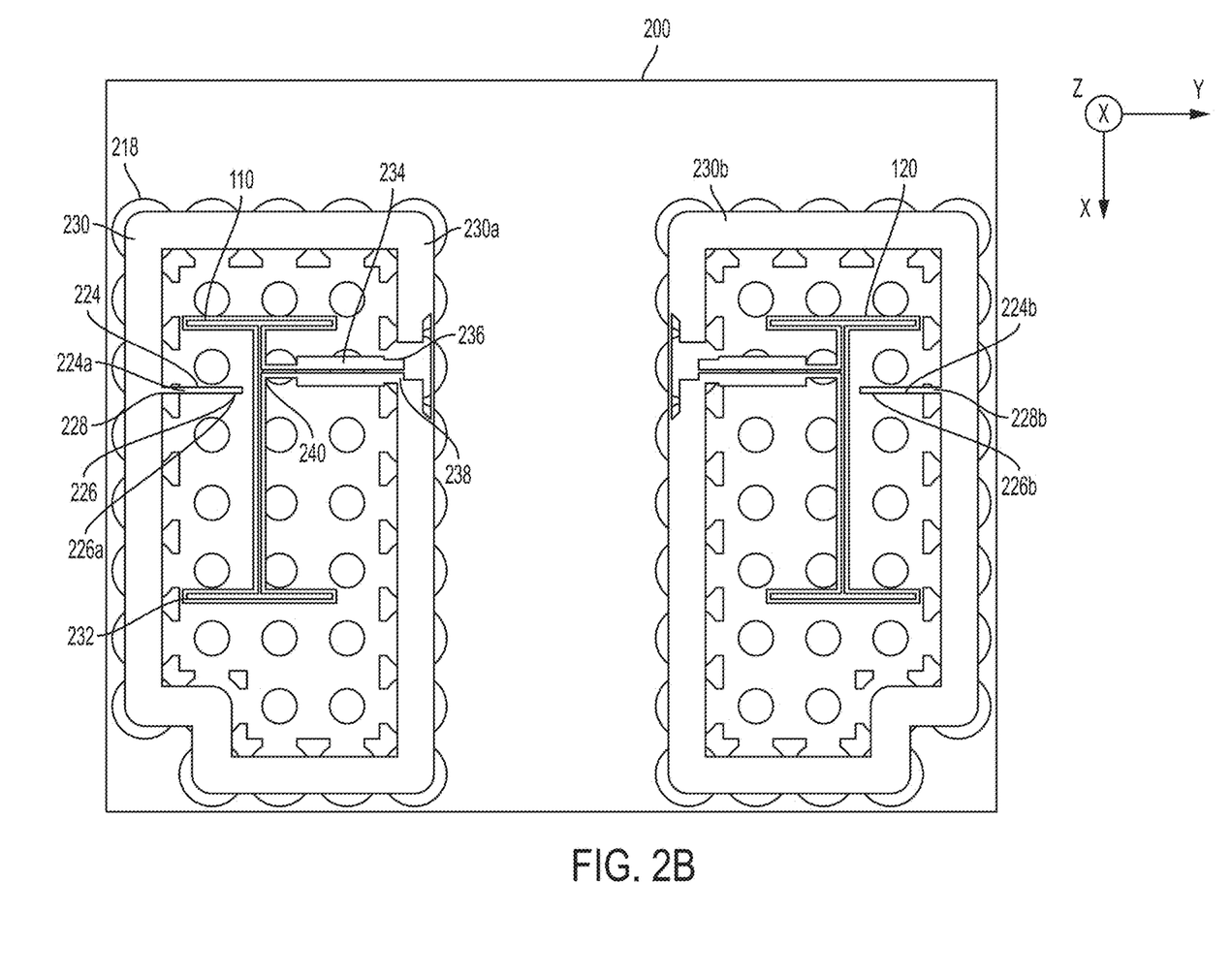
FIG. 2B is a top view of the illustrative RF device of FIG. 2A, according to some embodiments.

As illustrated in FIG. 2A, in some embodiments, the transmitter antenna 110 and the receiver antenna 120 may be formed in the first RDL 208. The transmitter antenna 110 may be spaced apart from the receiver antenna 120 along a y direction perpendicular to the z direction. Stubs 224 may also be formed in the first RDL 208. Referring to FIG. 2B now, each stub may have an open end 226(226b) and an end 228(228b) connected to a ground 230(230b). Each antenna may include an antenna element 232 and a feeder 234 connected to the antenna element. The feeder 234 may have a first end 238 connected to the ground 230, a second end 236 connected to an output of the chip 202 through, for example, vias, and a third end 240 connected to the antenna element 232. In some embodiments, the first end 238 may be connected to another output of the chip 202 in lieu of the ground 230.

The antennas may be tuned for a radio wave with a wavelength λ, depending on an intended application. For example, in a collision avoidance application (e.g., automotive parking assistant, autonomous vehicle, domestic robot, etc.), an RF device for mid-distance radars (e.g., 10-40 meters) may operate at 24 GHz band, while an RF device for long-distance radars (e.g., 100-150 meters) may be tuned to 78 GHz band. The inventors have recognized and appreciated that, in order for a stub to function effectively as an energy trap, it may be desirable to size the stub so that a length between the open end and the end connected to the ground is substantially equal to odd multiples of a quarter of the wavelength λ, for example, λ/4, 3λ/4, 5 λ/4, etc. It may be based on the stub characteristic, for example, when a stub has one end open and the other end short to a ground, a working length is about odd multiples of a quarter of the wavelength λ. However, aspects of the present disclosure is not limited in this regard. A stub may have any suitable length.

In the example shown in FIG. 2B, the transmitter antenna 110 has a stub 224a (in a conductive trace, e.g., a ground terminal 230a), which shares the ground terminal 230a with the transmitter antenna 110. The ground terminal 230a may substantially surround the transmitter antenna. Likewise, in the example shown in FIG. 2B, the receiver antenna 120 has a stub 224b (in a conductive trace, e.g., a ground terminal 230b), which shares the ground terminal 230b with the receiver antenna 120. The ground terminal 230b may substantially surround the receiver antenna 120. In the illustrative example, the ground terminals 230a and 230b substantially surround the transmitter and receiver antennas, respectively. However, aspects of the present disclose are not limited in this regard. Ground terminals may have any suitable shapes and lengths. The open end 226a of the stub 224a may point to the open end 226b of the stub 226b. A distance between the stubs 224a and 224b may be greater than a distance between the transmitter and receiver antennas. In some embodiments, the transmitter antenna 110 may be spaced apart from the receiver antenna 120 in the y direction. The stubs 224a and 224b may be elongated along the y direction.

Although the illustrative antennas shown in FIGS. 2A-2B have an I-shaped type, it should be appreciated that aspects of the present disclosure are not limited in this regard. The antennas may be of any suitable type including, for example, dipole, folder dipole, ring, rectangular loop, and patch. Although in the examples shown in FIGS. 2A-2B each antenna has one associated stub, it should be appreciated that aspects of the present disclosure are not limited in this regard. One antenna may have multiple associated stubs at different locations. The multiple stubs may have a same length in some embodiments, or different lengths. Although two antennas 110 and 120 are illustrated, it should be appreciated that aspects of the present disclosure are not limited in this regard. An RF device may include any suitable number of antennas, such as one, three, four, or more. Although the illustrated antennas may be transmitter antenna 110 and receiver antenna 120, it should be appreciated that aspects of the present disclosure are not limited in this regard. An RF device may include only one or more transmitter antennas, or only one or more receiver antennas, or any suitable number of transmitter antennas and any suitable number of receiver antennas in combination. Although in these examples the stubs have a rectangular shape, it should be appreciated that aspects of the present disclosure are not limited in this regard. Various stubs may have any suitable shapes including, for example, oval, polygon, and/or triangle.

Figure 2C:
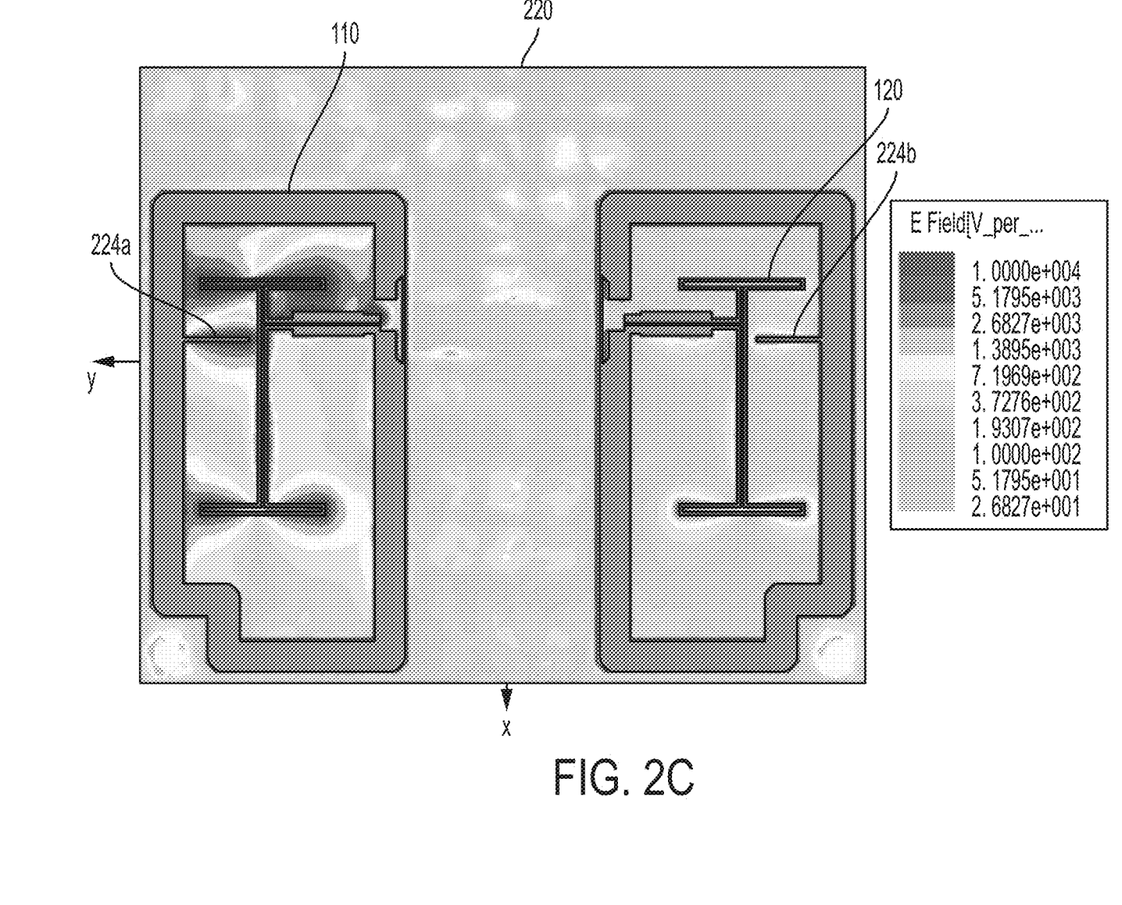
FIG. 2C is a top view of the illustrative RF device of FIG. 2A, showing electromagnetic field distribution.

In some embodiments, when the transmitter antenna 110 turns on, the transmitter antenna may induce an electromagnetic field distribution as illustrated in FIG. 2C. An intensity of the electromagnetic field may be proportional to a strength of transmitted radio waves. An intensity of the electromagnetic field may be increased at the open end of the stubs 224a and 224b, indicating that the conductive traces attract a portion of the energy radiated by the transmitter antenna 110. As a result, energy coupled by the receiver antenna 120 may be reduced.

Figure 2D:
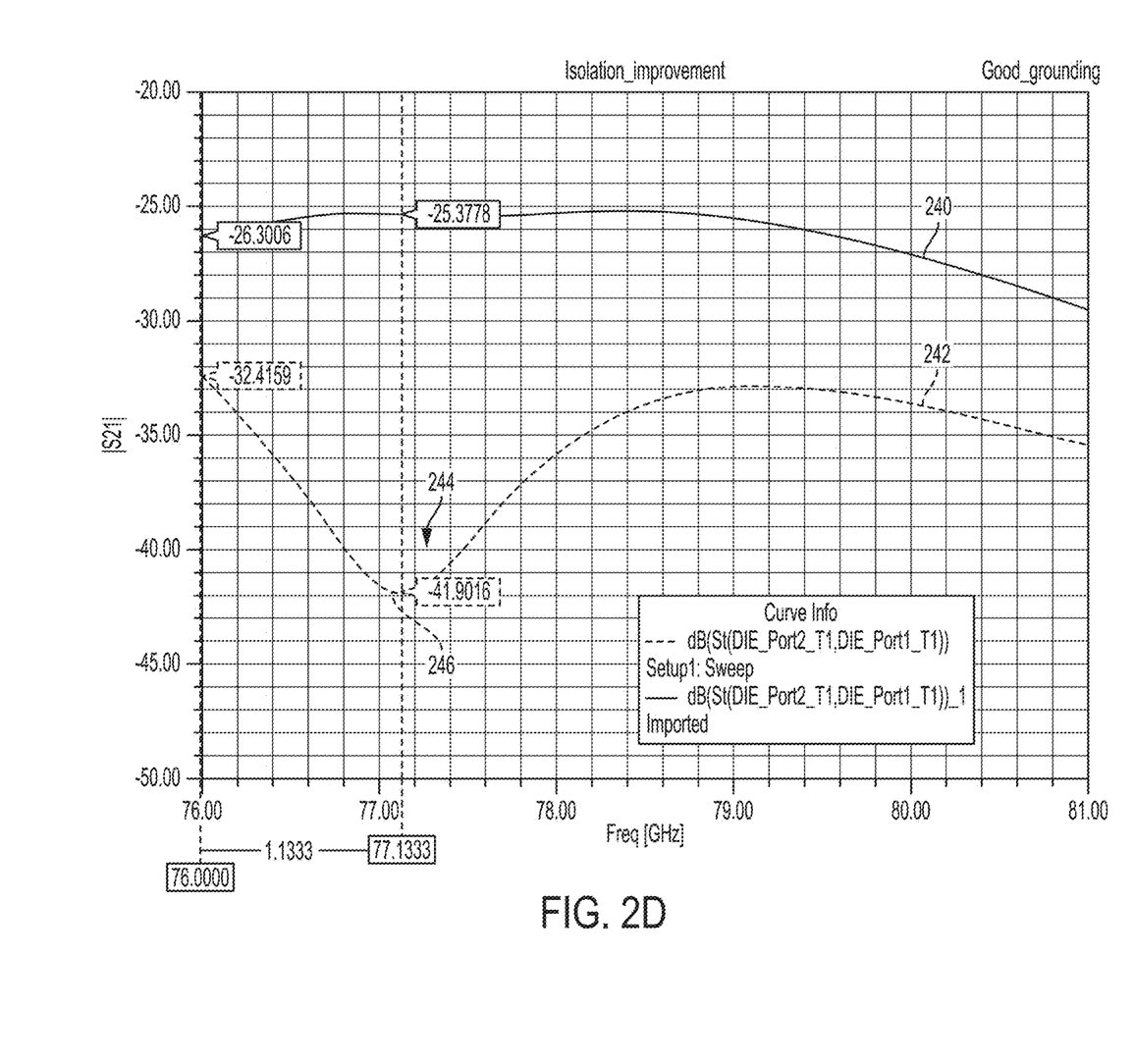
FIG. 2D is an isolation plot of the illustrative RF device of FIG. 2B, showing improved isolation between antennas compared to an RF device without any stub.

FIG. 2D is an isolation plot of the illustrative RF device 200 of FIGS. 2A-2C, compared with an RF device without any stub. A parameter S21 of the isolation plot represents power transferred from the transmitter antenna 110 to the receiver antenna 120. Curve 240 shows isolation performance of an RF device without any stub. Curve 242 shows isolation performance of the RF device 200. While the curve 240 is above −30 dB, the curve 242 is below −30 dB across an illustrated frequency range, indicating improved isolation between the antennas. Under the same package size, the RF device 200 may provide an average of 10 dB improvement over the RF device without any stub. Although the illustrated example shows curve 242 having a trough/notch 244 at 78 GHz, it should be appreciated that aspects of the present disclosure is not limited in this regard. The inventors have recognized and appreciated that conductive traces may be sized and positioned in accordance with an intended application. For example, multiple stubs with different lengths may be included to create troughs/notches at different frequency bands (e.g., a first trough/notch at 24 GHz and a second trough/notch at 78 GHz).

In some embodiments, a trough/notch may have a depth in the range of 1 dB to 200 dB. In some embodiments, a trough/notch may have a depth in the range of 2 dB to 100 dB. In some embodiments, a trough/notch may have a depth in the range of 5 dB to 20 dB. For example, in the illustrated example in FIG. 2D, the trough/notch 244 has a depth of about 9.5 dB.

In some embodiments, a lowest point of a trough/notch may be less than −30 dB in the range of 1 dB to 200 dB. In some embodiments, a lowest point of a trough/notch may be less than −30 dB in the range of 2 dB to 100 dB. In some embodiments, a lowest point of a trough/notch may be less than −30 dB in the range of 5 dB to 20 dB. For example, in the illustrated example in FIG. 2D, a lowest point 246 of the trough/notch 244 is about 11.9 dB below −30 dB.

Figure 3A:
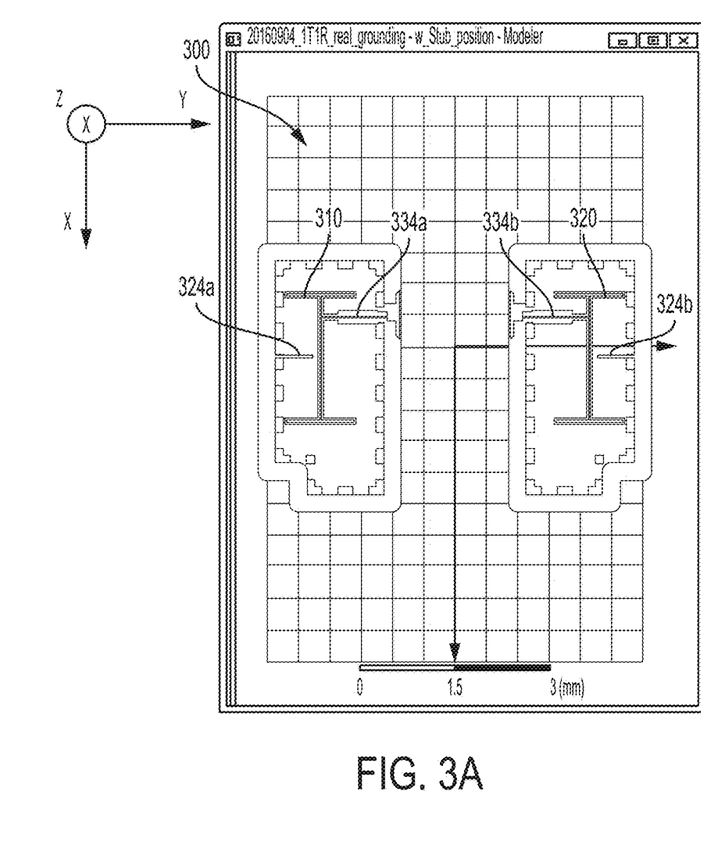
FIG. 3A is a top view of an illustrative RF device with stubs placed at alternative positions, according to some embodiments.

FIG. 3A is a top views of an illustrative RF device 300 with stubs placed at alternative locations, according to some embodiments. In some embodiments, the RF device 300 may have a same package size as the illustrative RF device 200 shown in FIGS. 2A-B, and may differ from the RF device 200 in that stub 324a is at a different position compared to the illustrative stub 224a of FIG. 2B along an x direction perpendicular to the y direction and z direction, and stub 324b is at a different position compared to the illustrative stub 224b of FIG. 2B along the x direction.

Figure 3B:
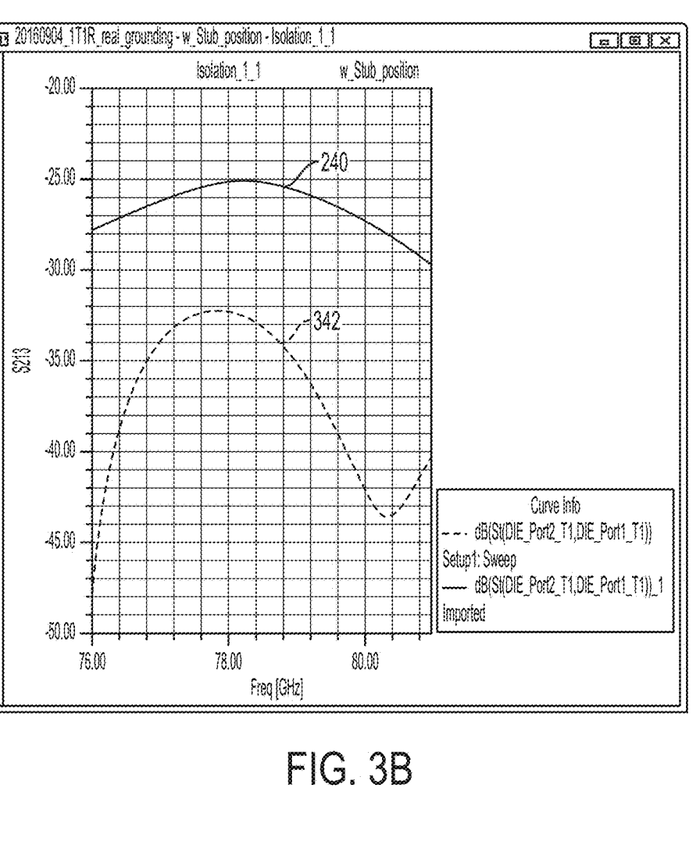
FIG. 3B is an isolation plot of the illustrative RF device of FIG. 3A, showing improved isolation between antennas, compared to an RF device without any stub.

FIG. 3B is an isolation plot of the illustrative RF device 300, showing improved isolation between the antennas, compared to an RF device without any stub. A parameter S213 of the isolation plot represents power transferred from the antenna 310 to the antenna 320. Curve 342 shows isolation performance of the RF device 300. Unlike the curve 242 shown in FIG. 2D, the curve 342 has a trough at about 81 GHz. Thus, by adjusting position of one or more stubs, improved isolation performance at different frequency ranges may be achieved.

Figure 4A:
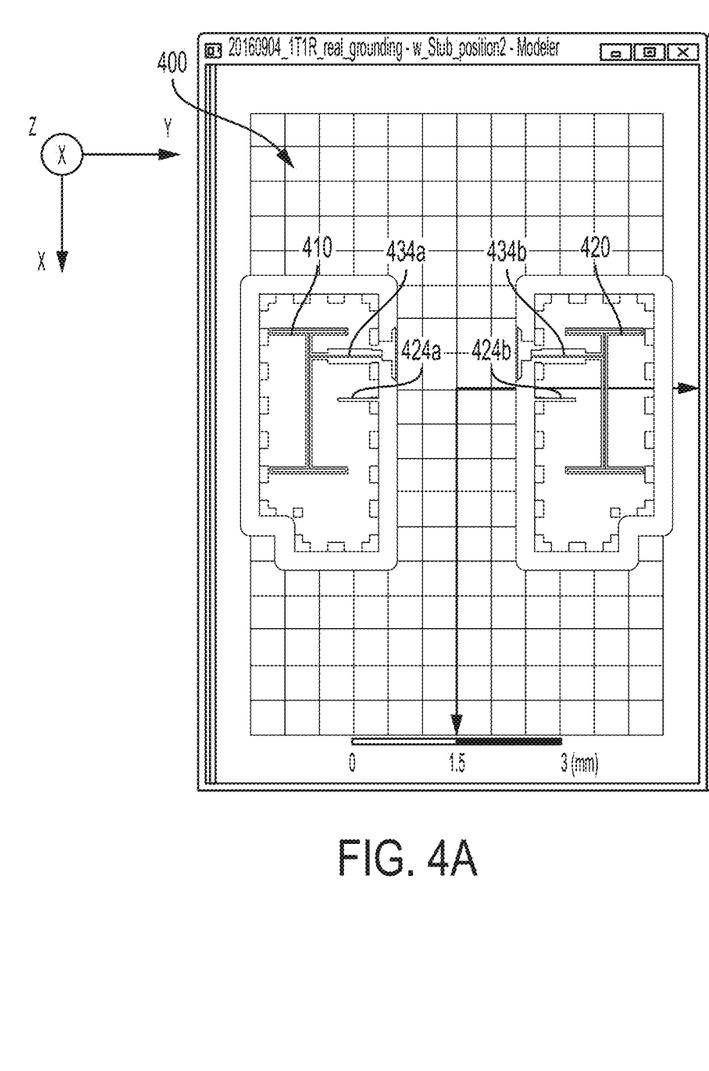
FIG. 4A is a top view of an illustrative RF device with stubs placed at alternative positions, according to some embodiments.

FIG. 4A is a top views of an illustrative RF device 400 with stubs placed at alternative locations, according to some embodiments. In this example, stubs 424a and 424b are placed between antenna 410 and antenna 420. (By contrast, the stubs 224a and 224b are placed outside of the antenna 110 and the antenna 120 in the example shown in FIG. 2B.) In some embodiments, the RF device 400 may have a same package size as the illustrative RF device 200 shown in FIGS. 2A-B.

Figure 4B:
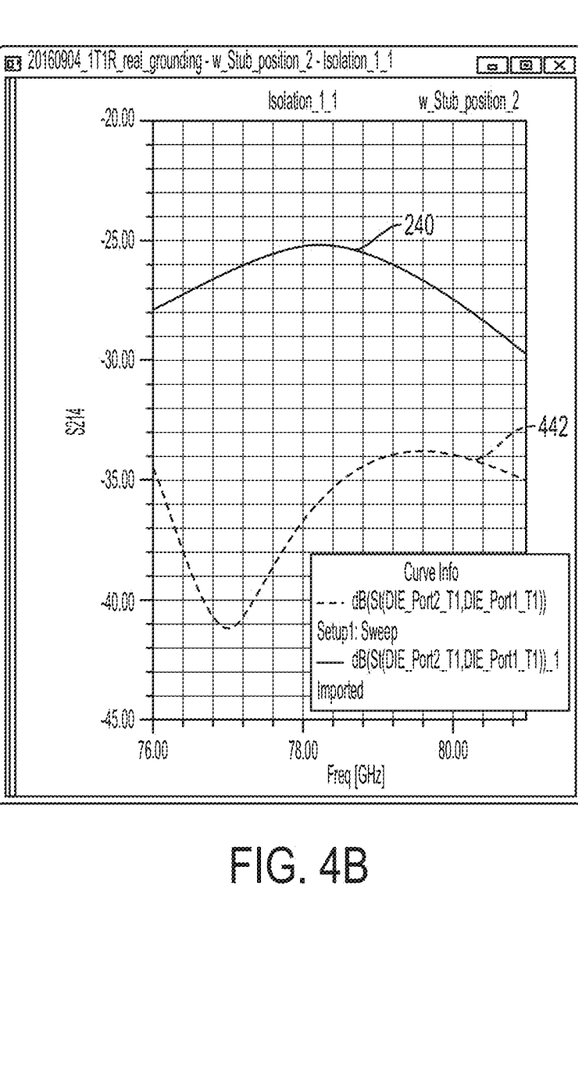
FIG. 4B is an isolation plot of the illustrative RF device of FIG. 4A, showing improved isolation between antennas, compared to an RF device without any conductive trace.

FIG. 4B is an isolation plot of the RF device 400, showing improved isolation between the antennas, compared to an RF device without any stub. A parameter S214 of the isolation plot represents power transferred from the antenna 410 to the antenna 420. Curve 342 shows isolation performance of the RF device 300.

Figure 5A:
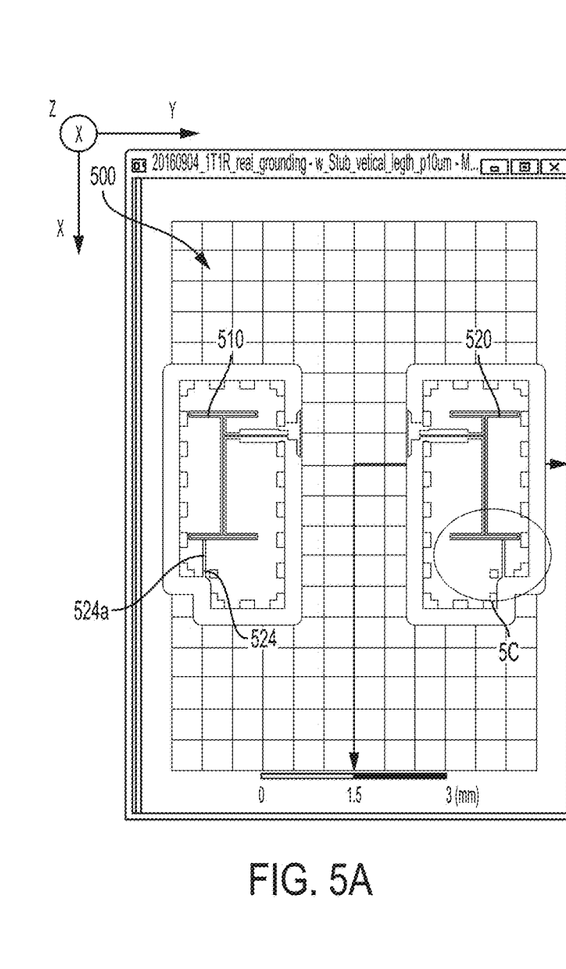
FIG. 5A is a top view of an illustrative RF device with stubs placed at alternative positions, according to some embodiments.
Figures 5B, 5C:
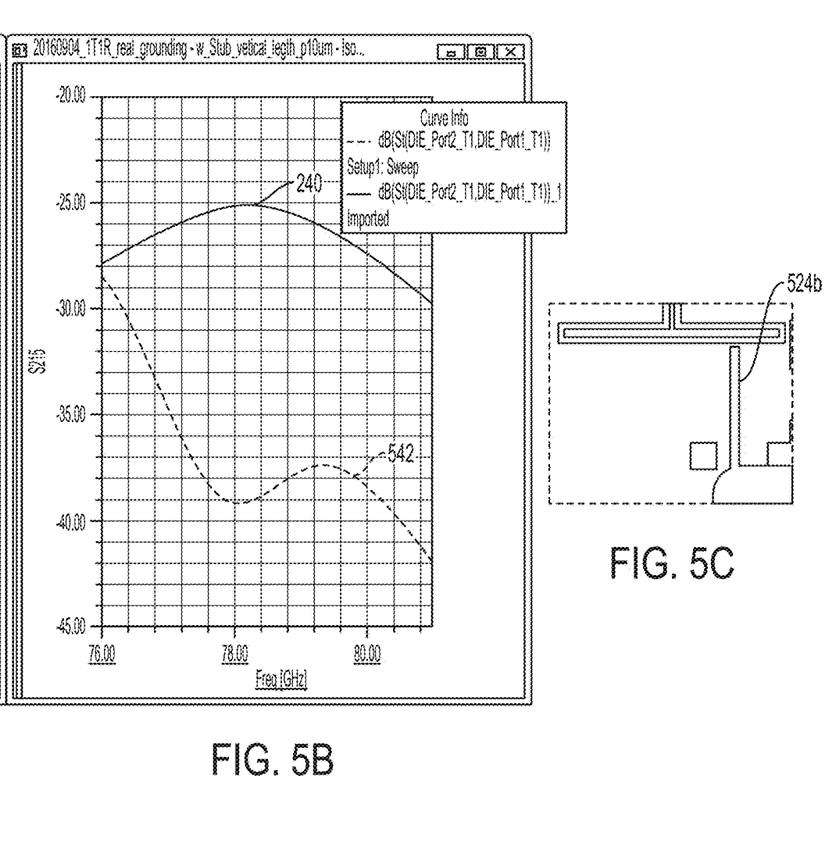
FIG. 5B is an isolation plot of the illustrative RF device of FIG. 5A, showing improved isolation between antennas, compared to an RF device without any stub.
FIG. 5C is an enlarged view of a marked region 5C in FIG. 5A.

FIG. 5A is a top views of an illustrative RF device 500 with stubs placed at alternative locations, according to some embodiments. In this example, stubs 524 are substantially perpendicular to corresponding feeders (as illustrated in FIG. 5C). (By contrast, the stubs 224 are substantially parallel to corresponding feeders in the example shown in FIG. 2B.) In some embodiments, the antenna 510 may be spaced apart from the antenna 520 in the y direction. The stubs 524a and 524b may be elongated along the x direction. In some embodiments, the stubs may be placed at an angle with respect to the y direction. In some embodiments, the RF device 500 may have a same package size as the illustrative RF device 200 shown in FIGS. 2A-B.

FIG. 5B is an isolation plot of the RF device 500, showing improved isolation between the antennas, compared to an RF device without any stub. A parameter S215 of the isolation plot represents power transferred from the transmitter antenna 510 to the receiver antenna 520. Curve 542 shows isolation performance of the RF device 500. In addition to a trough at around 78 GHz, the curve 542 continues to drop beyond 80 GHz. Thus, by adjusting orientation of one or more stubs, improved isolation performance at multiple frequency ranges may be achieved.

Figure 6A:
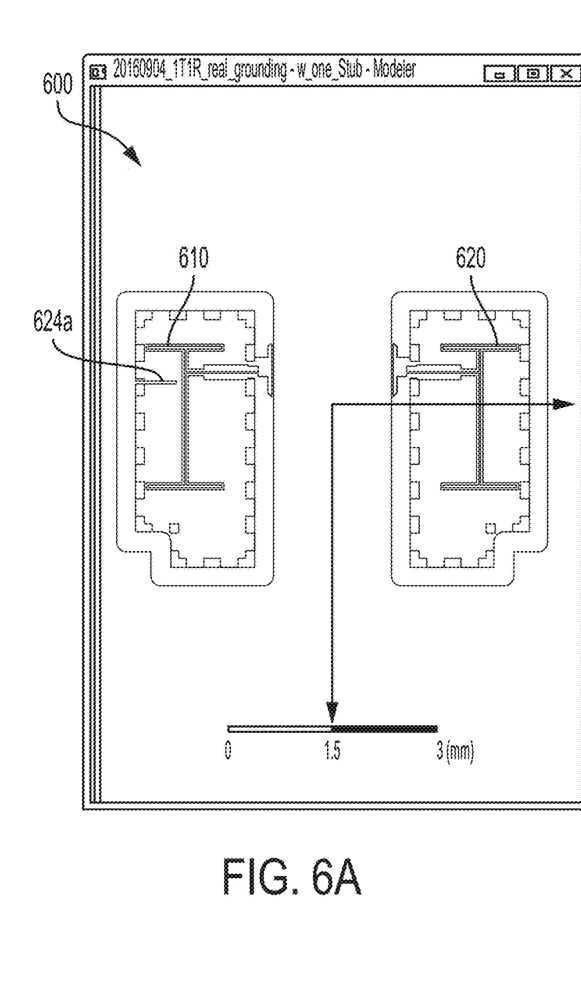
FIG. 6A is a top view of an illustrative RF device, according to some embodiments.
Figure 6B:
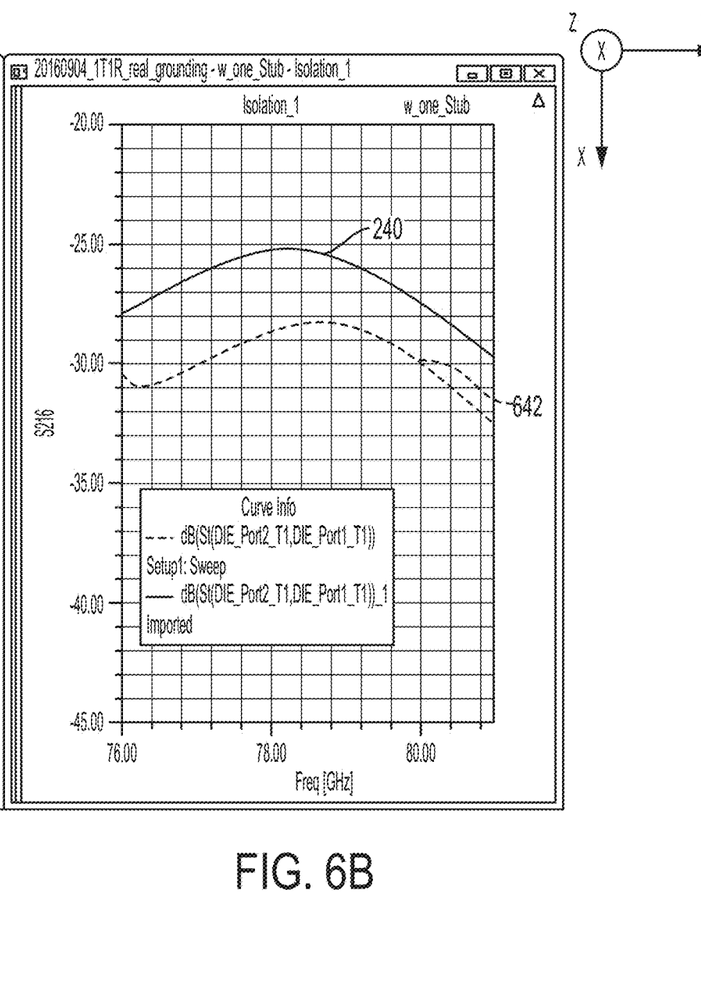
FIG. 6B is an isolation plot of the illustrative RF device of FIG. 6A, showing improved isolation between antennas, compared to an RF device without any stub.

FIG. 6A is a top view of an RF device 600 with one stub 624a for an antenna 610 and no stub for a second antenna 620, according to some embodiments. FIG. 6B is an isolation plot of the RF device 600, compared to an RF device without any stub. A parameter S216 of the isolation plot represents power transferred from the antenna 610 to the antenna 620. Curve 642 shows isolation performance of the RF device 600. Under a same package size, the RF device 600 may provide an average of about 3 dB improvement over the RF device without any stub.

Figure 7:
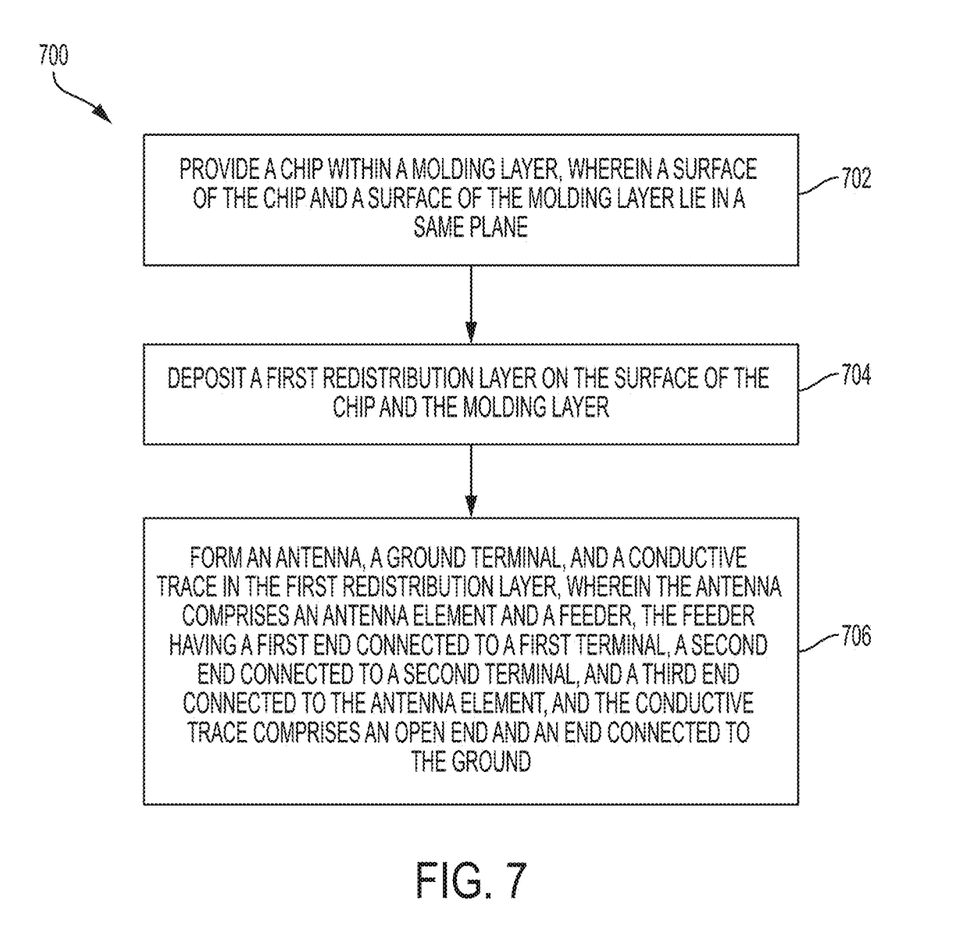
FIG. 7 is a flowchart showing an illustrative method of manufacturing an RF device described herein, according to some embodiments.

FIG. 7 shows an illustrative method 700 for manufacturing an RF device described herein, according to some embodiments. The method 700 may begin at act 702, in which a chip within a molding layer may be provided. In some embodiments, the molding layer may be a molding compound layer for a package. A surface of the chip and a surface of the molding layer may lie on a same plane. At act 704, a first redistribution layer may be deposited on the surface of the chip and the surface of the molding layer. At act 706, an antenna, a ground terminal, and a conductive trace may be formed in the first redistribution layer. In some embodiments, the antenna, ground terminal, and conductive trace may be formed by etching the first redistribution layer. The antenna may comprise an antenna element and a feeder. The feeder may have a first end connected to a first terminal, a second end connected to a second terminal, and a third end connected to the antenna element. In some embodiments, the first terminal may be a first output of the chip and the second terminal may be a second output of the chip. In some embodiments, the first terminal may be the ground terminal and the second terminal may be an output of the chip. The stub may comprise an open end and an end connected to the ground.

Various aspects of the apparatus and techniques described herein may be used alone, in combination, or in a variety of arrangements not specially discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

The terms "approximately", "substantially," and "about" may be used to mean within ±20% of a target value in some embodiments, within ±10% of a target value in some embodiments, within ±5% of a target value in some embodiments, and yet within ±2% of a target value in some embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A Radio Frequency (RF) device, comprising:
   first and second antennas formed in a redistribution layer of a package;
   at least one conductive trace formed in the redistribution layer of the package, the at least one conductive trace separate from the first and second antennas, wherein the first antenna is a transmitter antenna, the second antenna is a receiver antenna, and the at least one conductive trace is sized and positioned to couple energy from the first antenna; and
   first and second ground terminals.

2. The device of claim 1, wherein both the first and second antennas are positioned on a same side of each of the at least one conductive trace.

3. The device of claim 1, wherein the at least one conductive trace comprises first and second conductive traces, wherein the first conductive trace is connected to the first ground terminal and the second conductive trace is connected to the second ground terminal.

4. The device of claim 1, wherein the RF device is tuned for a wavelength λ, the at least one conductive trace has an open end and an end connected to the first ground terminal, and a length between the open end and the end connected to the first ground terminal is substantially equal to an odd multiple of a quarter of the wavelength λ.

5. The device of claim 1, wherein each of the first and second antennas comprises an antenna element and a feeder, and a distance between the antenna elements of the first and second antennas is greater than a distance between the feeders of the first and second antennas.

6. The device of claim 4, wherein an isolation between the first and second antennas has a notch at a frequency corresponding to the wavelength λ.

7. The device of claim 6, wherein a lowest point of the notch is less than −35 dB.

8. A Radio Frequency (RF) device, comprising:
   a molding layer;
   a chip embedded within the molding layer;
   a redistribution layer coupled to the chip;
   an antenna formed in the redistribution layer; and
   a conductive trace formed in the redistribution layer, the conductive trace sized and positioned for trapping a portion of energy transmitted from the antenna.

9. The device of claim 8, wherein the chip comprises a transmitter and/or a receiver.

10. The device of claim 8, wherein the antenna comprises an antenna element and a feeder, the feeder has a first end connected to one of a group of terminals consisting of a ground terminal and a first output of the chip, a second end connected to a second output of the chip, and a third end connected to the antenna element, and the conductive trace comprises an open end and an end connected to the ground terminal.

11. The device of claim 10, wherein the conductive trace is substantially parallel to the feeder.

12. The device of claim 10, wherein the conductive trace is substantially perpendicular to the feeder.

13. The device of claim 8, wherein the conductive trace comprises an open end and an end connected to a ground, the antenna is tuned for a wavelength λ, and a length between the open end of the conductive trace and the end connected to the ground is substantially equal to an odd multiple of a quarter of the wavelength.

14. The device of claim 8, wherein:
   the conductive trace is a first conductive trace,
   the device comprises a plurality of conductive traces formed in the redistribution layer, each of the plurality of conductive traces comprises an open end and an end connected to a ground terminal, and
   the plurality of conductive traces include the first conductive trace.

15. The device of claim 14, wherein the first conductive trace has a first length selected to improve isolation performance in a first frequency range, and a second conductive trace of the plurality of conductive traces has a second length different from the first length, the second length being selected to improve isolation performance in a second frequency range different from the first frequency range.

16. The device of claim 10, wherein:
   the antenna is a first antenna,
   the antenna element is a first antenna element,
   the feeder is a first feeder,
   the chip is a transmitting chip,
   the ground terminal is a first ground terminal,
   the device further comprises a second antenna formed in the redistribution layer,
   the second antenna comprises a second antenna element and a second feeder, and
   the feeder has a first end connected to one of a group of terminals consisting of a second ground terminal and a first output of a receiving chip, a second end connected to a second output of the receiving chip, and a third end connected to the second antenna element.

17. The device of claim 16, wherein:
the device comprises a second conductive trace formed in the redistribution layer, and
the second conductive trace comprises an open end and an end connected to the second ground terminal.

18. The device of claim 17, wherein a distance between the first and second conductive traces is greater than a distance between the first and second antenna elements.

19. The device of claim 8, wherein the redistribution layer is metallic.

* * * * *